(12) United States Patent
Deng et al.

(10) Patent No.: US 8,477,500 B2
(45) Date of Patent: Jul. 2, 2013

(54) LOCKING DEVICE AND METHOD FOR MAKING THE SAME

(75) Inventors: Tao Deng, Clifton Park, NY (US); Todd Garrett Wetzel, Niskayuna, NY (US); Hendrik Pieter Jacobus de Bock, Clifton Park, NY (US); Boris Alexander Russ, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/787,191

(22) Filed: May 25, 2010

(65) Prior Publication Data

US 2011/0292613 A1    Dec. 1, 2011

(51) Int. Cl.
*H05K 7/20* (2006.01)
*F28F 27/00* (2006.01)
*F25D 29/00* (2006.01)

(52) U.S. Cl.
USPC ........... 361/710; 361/709; 361/720; 165/276; 62/383

(58) Field of Classification Search
USPC .......... 337/298, 324, 392–394, 299; 361/709, 361/710, 720; 165/276; 62/383
See application file for complete search history.

(56) References Cited

U.S. PATENT DOCUMENTS

| | | | | |
|---|---|---|---|---|
| 3,306,075 A * | 2/1967 | Cowans | | 62/51.1 |
| 3,399,717 A * | 9/1968 | Cline | | 165/276 |
| 3,519,067 A * | 7/1970 | Schmidt | | 165/272 |
| 3,531,752 A * | 9/1970 | Gourley | | 337/139 |
| 3,586,102 A * | 6/1971 | Gilles | | 165/186 |
| 3,852,803 A | 12/1974 | Walmet et al. | | |
| 3,957,107 A * | 5/1976 | Altoz et al. | | 165/276 |
| 4,323,914 A * | 4/1982 | Berndlmaier et al. | | 257/713 |
| 4,402,358 A * | 9/1983 | Wolf | | 165/276 |
| 4,770,004 A * | 9/1988 | Lagodmos | | 62/383 |
| 4,791,983 A * | 12/1988 | Nicol et al. | | 165/80.4 |
| 4,951,740 A * | 8/1990 | Peterson et al. | | 165/276 |
| 4,997,032 A * | 3/1991 | Danielson et al. | | 165/46 |
| 5,000,256 A * | 3/1991 | Tousignant | | 165/46 |
| 5,323,294 A * | 6/1994 | Layton et al. | | 361/699 |
| 5,379,601 A * | 1/1995 | Gillett | | 62/51.1 |
| 5,561,590 A * | 10/1996 | Norell et al. | | 361/699 |
| 5,682,751 A * | 11/1997 | Langhorn et al. | | 62/51.1 |
| 5,842,348 A * | 12/1998 | Kaneko et al. | | 62/51.1 |
| 6,212,075 B1 | 4/2001 | Habing et al. | | |
| 6,246,582 B1 | 6/2001 | Habing et al. | | |
| 6,276,144 B1 * | 8/2001 | Marland et al. | | 62/51.1 |
| 6,305,174 B1 * | 10/2001 | Binneberg et al. | | 62/6 |

(Continued)

FOREIGN PATENT DOCUMENTS

DE    19581457 C1    4/1999

*Primary Examiner* — Anatoly Vortman
(74) *Attorney, Agent, or Firm* — Scott J. Asmus

(57) ABSTRACT

A locking device providing thermal management for an electrical assembly board is described and includes a fluid-permeable member saturated with a fluid and disposed between the electrical assembly board and a heat sink; a pair of locking device substrates substantially orthogonal to the electrical assembly board and the heat sink; and an actuator coupled to at least one of the locking device substrates. The fluid-permeable member is disposed between the locking device substrates. The actuator is configured to compress the fluid-permeable member by at least one of the locking device substrates forcing a portion of the fluid out of the fluid-permeable member and forming at least one fluid contact interface with the electrical assembly board and the heat sink in a reversible process. A method for making a locking device is also described.

15 Claims, 5 Drawing Sheets

U.S. PATENT DOCUMENTS

| | | | |
|---|---|---|---|
| 6,665,186 B1 * | 12/2003 | Calmidi et al. | 361/704 |
| 6,829,145 B1 * | 12/2004 | Corrado et al. | 361/704 |
| 7,063,127 B2 * | 6/2006 | Gelorme et al. | 165/80.2 |
| 7,154,369 B2 * | 12/2006 | Dietz et al. | 337/394 |
| 7,349,221 B2 | 3/2008 | Yurko | |
| 7,392,836 B2 * | 7/2008 | Wong | 165/104.26 |
| 7,411,792 B2 * | 8/2008 | Richards et al. | 361/704 |
| 7,709,951 B2 * | 5/2010 | Brodsky et al. | 257/713 |
| 7,752,866 B2 * | 7/2010 | Vaidyanathan et al. | 62/383 |
| 7,755,899 B2 * | 7/2010 | Stenmark | 361/710 |
| 7,760,504 B2 * | 7/2010 | Farrow et al. | 361/704 |
| 7,995,344 B2 * | 8/2011 | Dando et al. | 361/710 |
| 2004/0074630 A1 * | 4/2004 | Sen et al. | 165/46 |
| 2004/0188829 A1 * | 9/2004 | Hu et al. | 257/712 |
| 2005/0061474 A1 * | 3/2005 | Gelorme et al. | 165/80.2 |
| 2006/0109631 A1 | 5/2006 | Marro et al. | |
| 2007/0056714 A1 * | 3/2007 | Wong | 165/104.26 |
| 2007/0253169 A1 | 11/2007 | Clawser | |
| 2008/0186678 A1 | 8/2008 | North et al. | |
| 2009/0001576 A1 | 1/2009 | Tuli et al. | |

* cited by examiner

LOCKING DEVICE AND METHOD FOR MAKING THE SAME

BACKGROUND

The disclosure generally relates to a mechanical and thermal connection device, and more particularly to a thermal-conductance locking device with the purpose of securing one or more members in an electrical assembly.

An electrical assembly generally has a printed circuit board (PCB), a heat sink chassis and may employ a locking device. The locking device is typically used to keep the electrical assembly physically coupled to the heat sink chassis so that heat is dissipated from the assembly across the locking device to the heat sink chassis. Optionally the electrical assembly can also contain a heat spreader between the locking device and the heat sink chassis. The PCB typically has a plurality of electrical components mounted thereon. In operation, the PCB and/or the electrical components on the PCB can generate heat. The optional heat spreader and the heat sink chassis are thermally conductive and cooperate together to dissipate the generated heat to the exterior or to a coolant. The locking device is typically employed to firmly secure the PCB and/or the heat spreader onto the heat sink chassis and provide thermal conductance paths therebetween.

As electronic components operating temperatures are limited, it is normally desirable to remove the heat with a minimum temperature difference between the microelectronics and coolant. This translates into a desire for cooling solutions to have minimal thermal resistance. Currently, for most electrical assemblies, the contact interfaces among the locking device, the PCB and the heat sink chassis (or the heat spreader) are metal surface contacts (referred to as "metal bulk contact"). For metal bulk contact, the thermal resistance is primarily impacted by the roughness of the contact surfaces and contact pressure. However, in some applications, the roughness of the contact surfaces or the contact pressure is difficult to control.

Furthermore, miniaturization of electronic components has led to increased power requirements and high-density packaging, leading to an increase in heat generation per assembly. Therefore, there is a need to provide an improved locking device with greater thermal conductance to maintain the electrical assembly within temperature specifications.

BRIEF DESCRIPTION

In accordance with one embodiment, a locking device providing thermal management for an electrical assembly board comprises: a fluid-permeable member saturated with a fluid and disposed between the electrical assembly board and a heat sink; a pair of locking device substrates substantially orthogonal to the electrical assembly board and the heat sink; and an actuator coupled to at least one of the locking device substrates. The fluid-permeable member is disposed between the locking device substrates. The actuator is configured to compress the fluid-permeable member by at least one of the locking device substrates forcing a portion of the fluid out of the fluid-permeable member and forming at least one fluid contact interface with the electrical assembly board and the heat sink in a reversible process.

In accordance with another embodiment, an electrical assembly comprises: an electrical circuit board generating heat; a heat sink coupled to the electrical circuit board for dissipating the generated heat; and a locking device interposed between the electrical circuit board and the heat sink. The locking device comprises a plurality of contact interfaces therebetween, and at least one of the contact interfaces is a fluid-permeable member saturated with a fluid. The fluid is squeezed out of the contact interface when compressed by the locking device to form at least one fluid contact interface in a reversible process.

In accordance with a further embodiment, a method for making a locking device comprises: providing a fluid-permeable member; providing a pair of locking device substrates for retaining the fluid-permeable member; saturating a fluid into the fluid-permeable member; and providing an actuator coupled to the fluid-permeable member for initiating the fluid to be squeezed out of the fluid-permeable member to form a fluid contact interface in a reversible process.

These and other advantages and features will be further understood from the following detailed description of embodiments of the invention that are provided in connection with the accompanying drawings.

DETAILED DESCRIPTION

Embodiments of the present disclosure will be described hereinbelow with reference to the accompanying drawings. In the following description, well-known functions or constructions are not described in detail to avoid obscuring the disclosure in unnecessary detail.

Figure 1:
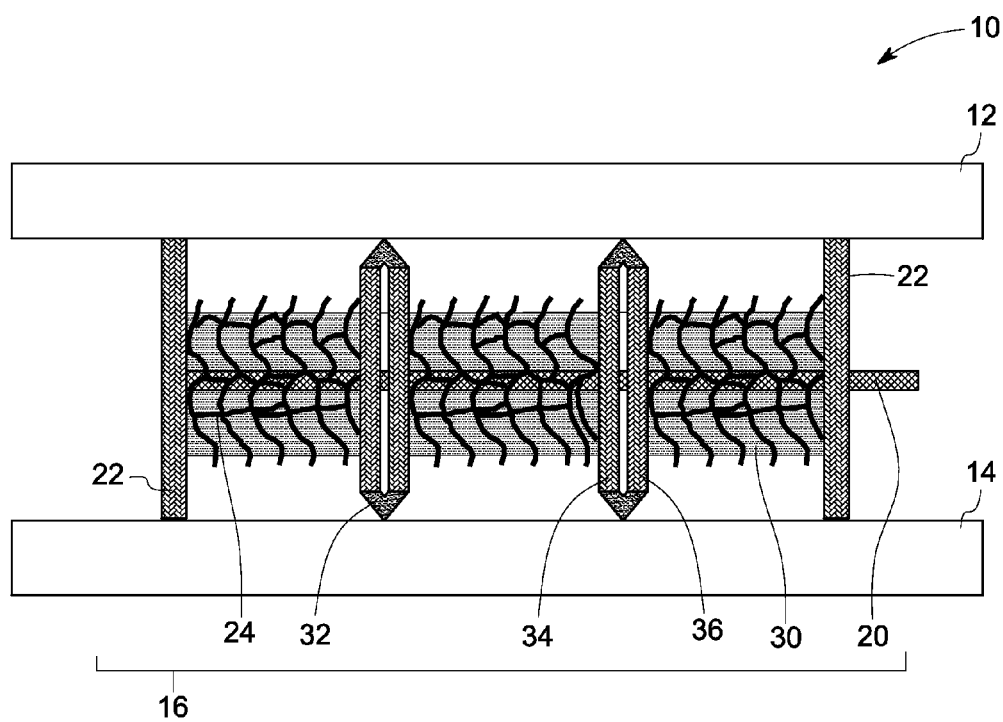
FIG. 1 is a schematic diagram of an electrical assembly in a non-engaged status in accordance with one embodiment.

FIG. 1 illustrates an electrical assembly 10 in accordance with one embodiment. The electrical assembly 10 includes a heat sink 12, an electrical assembly board 14 and a locking device 16. The locking device 16 is located between the heat sink 12 and the electrical assembly board 14 for achieving improved mechanical and thermal connection therebetween.

It should be understood that the electrical assembly board 14 includes but is not limited to a printed wiring board (PWB), a printed circuit board (PCB), and a circuit card. Other components having similar properties as PCB, PWB and circuit cards are also within the scope of the thermal management system. In one embodiment, the electrical assembly board 14 has a plurality of the electrical components (not shown) on one side. In another embodiment, the electrical components are distributed on both sides of the electrical assembly board 14.

The heat sink 12 can be, for example, a heat sink chassis such as a cold plate or a heat spreader. In one embodiment, the heat sink 12 includes a heat spreader and a heat sink chassis. The heat spreader first conducts the heat generated by the electrical assembly board 14 or the electrical components on the electrical assembly board 14, and then the heat sink chassis transfers the heat from the heat spreader to the exterior or to a cooling mechanism.

The locking device 16 has a fluid-permeable member 24, one or more outer planar substrate member 22 for holding the fluid-permeable member 24 and an actuator 20. In the example shown in FIG. 1, the fluid-permeable member 24 is a nano-structured metal sponge and divided into several sponge sections each of which is secured by corresponding substrates such as outer planar substrate member 22, and interior members 34 and 36. It should be pointed out that other holding structures also can be used with the fluid-permeable member 24 and the actuator 20, particularly if having activation through mechanical insertion. It should be readily understood that while the actuator in this example is an internal mechanism, the actuator can also be external and impart a force on the exterior wall of one or both exterior substrates to compress or decompress the fluid-permeable member. A modified C-clamp, tooth and gear assembly, plunger, threaded member exteriorly coupled to the substrates are some of the actuator designs within the scope of this disclosure. In one embodiment, the fluid-permeable member 24 is a micro-structured conductive sponge whose pores therein can be configured to have 10~100 micron diameter.

The actuator 20 in one example extends internally through or externally along the outer planar substrates 22 and connects them together. In one embodiment, the actuator 20 is a screw that includes an inner thread portion and an outer thread portion one of which is affixed to one end of the locking device 16. The two thread portions are engaged to provide opposite movement once the screw is torqued. In another embodiment, the actuator 20 is a plunger or sliding element that according to another embodiment includes a fixed portion and a movable portion. The movable portion in one embodiment defines a hole through which the plunger or sliding element can slide.

Figure 2:
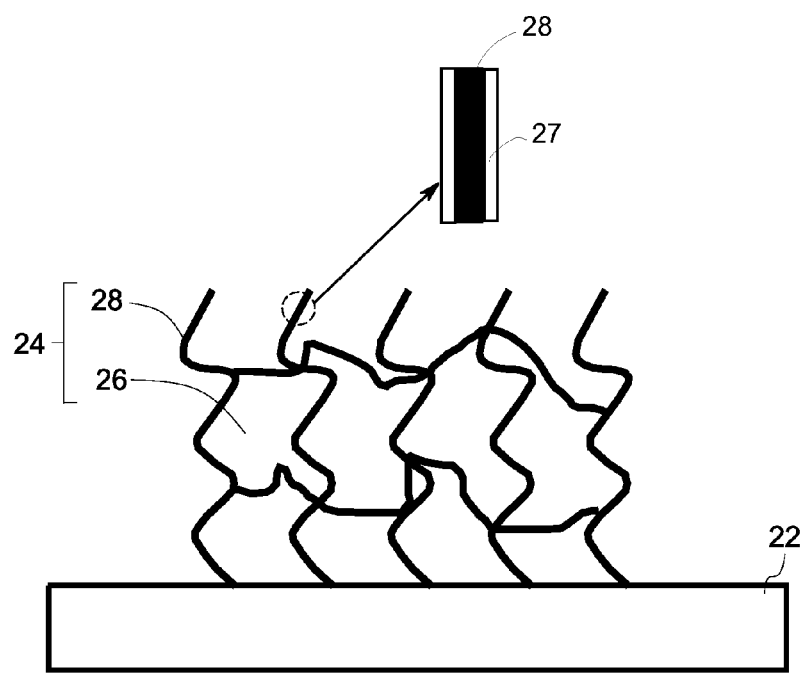
FIG. 2 is a partially enlarged view of a locking device of the electrical assembly shown in FIG. 1.

FIG. 2 is a partially enlarged view of one substrate 22 and the fluid-permeable member 24. The fluid-permeable member 24 in this example is orthogonally coupled to the substrate 22 and has a plurality of pores 26 and in this embodiment a network of metal wires 28. The metal wires 28 can be made of copper (Cu), gold (Au), titanium (Ti), silver (Ag), nickel (Ni), platinum (Pt), palladium (Pd) or compositions thereof. In certain embodiments, Cu is used because of its high thermal conductivity, mechanical strength and corrosion resistance. The metal wires 28 can also have hollow core or polymeric core. In one embodiment, the fluid-permeable member 24 is made of sintered particles such as aluminum nitride (AlN) or copper particle spheres. In another embodiment, the fluid-permeable member 24 is made of polymer foam. Other porous wick structure with enough thermal conductivity and compressing ability also falls in the scope of the fluid-permeable member 24. In one embodiment, the pores 26 are configured to be 10-10000 nm and the width of the individual metal wire is configured to be 10-10000 nm. In one embodiment, the metal wires 28 is coated with a passivation layer 27 for improving the wetting of the liquid metal such as 30 in FIG. 1 as well as preventing corrosion or oxidation. In another embodiment, the passivation layer 27 can be made of an appropriate material such as Au.

Referring again to FIG. 1, in one example, the fluid-permeable member 24 is thermally conductive and can be made of Cu, Au, Ti or other suitable thermal-conductive materials. The fluid-permeable member 24 is saturated with liquid metal 30 and provides capillary forces to hold the liquid metal 30 in position. It should be noted that the term "saturated" is not limited to be fully saturated and includes partially saturated. That means the fluid-permeable member 24 is not necessary to be fully filled with the liquid metal 30. Although the liquid metal 30 is described in the fore-going and following embodiments, it is understood that the liquid metal is not the only possible fluid for being saturated in the fluid-permeable member 24, other fluids also fall in the scope of the invention as long as the surface tension and thermal conductivity of these fluids can meet the practical requirements. The term "fluid" indicates one substance that is liquid at operating temperature of the locking device 16.

Referring to FIG. 1, the liquid metal 30 such as the metal or metal alloy is liquid at operating temperature. In one embodiment, the liquid metal 30 is gallium, indium, tin, indalloy or galinstant. The liquid metal 30 can be liquid or solid at room temperature. Properties of the liquid metal 30 can be tuned via alloy compositions to control solid/liquid transition depending on application needs. In some examples, the liquid metal 30 is liquid at both room temperature and operating temperature that is higher than room temperature. In other examples, the liquid metal 30 is solid at room temperature and will transfer to liquid phase at higher operating temperature.

In a further example, there are bendable spacers 32 flexibly connecting adjacent interior substrates such as 34 and 36 and the bendable spacers 32 are under a non-engaged status shown in FIG. 1. FIG. 1 shows the adjacent interior substrates 34 and 36 in close proximity to each other and the bendable spacer 32 is a flexible material that is in a relaxed state. The bendable spacers 32 are used to create sections that divide the metal liquid 30 after disengaging the locking device. In some applications, the bendable spacer 32 is not provided if the surface tension is high enough to break the liquid metal 30. The bendable spacers 32 can also function to provide a gap in between each set of compressed fluid-permeable members, thereby allowing the metal liquid 30 that is pressed out of the fluid-permeable member 24 to spread out completely along the interface between the bendable spacers 32 and the heat sink 12 in a containable fashion. The increased contact area leads to an enhanced thermal conductivity. The bendable spacers in one example allow the interior substrate(s) 36 to create partitioned sections.

In yet a further embodiment, there are sidewalls (not shown) that may be coupled to the heat sink and electrical assembly board and also to one or more of the substrates to form an enclosure about the sponge. The enclosure not only prevents seepage of any liquid metal, but also prevents dirt and debris from collecting in the fluid-permeable member. In lieu of the sidewalls, a housing can be placed proximate the locking device to wholly or partially enclose the locking device.

Figure 3:
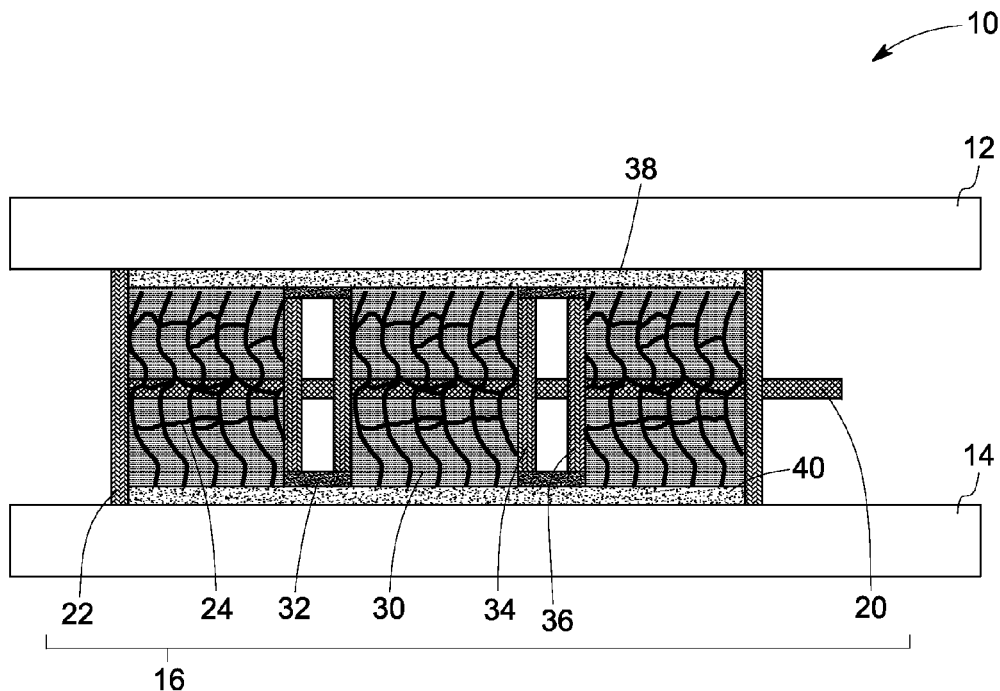
FIG. 3 is the electrical assembly of FIG. 1 in an engaged status.
Figure 4:
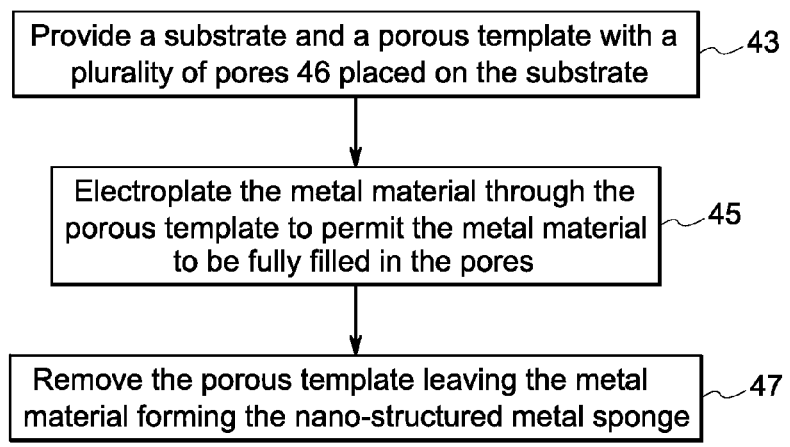
FIG. 4 is a flow chart of a method for making a fluid-permeable member in accordance with another embodiment.

Referring to FIG. 3, the actuator 20 is torqued such that the substrates 22 are forced towards each other. As the substrates 22 move closer to each other, the fluid-permeable members 24 are compressed causing the liquid metal 30 to be squeezed from the fluid-permeable member 24 to form fluid contact interfaces such as liquid metal contact interfaces 38 and 40 in a reversible process between the locking device 16 and heat sink 12 as well as the electrical assembly board 14. Reversible process indicates the liquid metal forming the contact interfaces 38 and 40 can come back into the fluid-permeable members 24 if the fluid-permeable member 24 is uncompressed. Fluid contact interfaces have smaller contact roughness and less contact pressure than metal bulk contact interfaces such that the thermal resistance of the electrical assembly is reduced, thereby improving thermal conductance performance. Compared with the metal bulk contact interfaces, the liquid metal contact interfaces 38 and 40 reduce the thermal resistance of the electrical assembly 10 by almost ten times.

Further, in one embodiment adjacent locking sets move in opposite directions. In the example shown in FIG. 3, the locking set has several sponge sections and two exterior planar substrates 22 holding the sponge sections therebetween. At the same time, the bendable spacers 32 are pushed apart with the flexible material being stretched to be approximately flattened and flush with the liquid metal interfaces 38, 40. The liquid metal 30 that is pressed out of the fluid-permeable member 24 is spread out completely along the interface between the bendable spacers 32 and chassis 12, forming the liquid metal interface 38 thereby leading to increased contact area and the thermal resistance is further reduced.

In one embodiment when the actuator 20 is turned in the initial position, the locking sets move back to their starting position and the fluid-permeable member 24 returns to the initial uncompressed state and the liquid metal 30 is pulled or drawn back into the fluid-permeable member 24 via their capillary force.

Thus, in operation according to one example, the actuator 20 in conjunction with one or more substrates compresses the fluid-permeable member 24 such that it pushes the liquid metal 30 outwards causing it to contact the surface of both the heat sink 12 and the electrical assembly board 14. One example shows the fluid-permeable member 24 in an uncompressed (non-engaged) state such as in FIG. 1 wherein there is no contact with the heat sink 12 or the electrical assembly board 14. In the compressed (engaged) state such as shown in FIG. 3, the fluid-permeable member 24 is compressed by the actuator 20 and substrates 22 such that the liquid metal 30 contacts the heat sink 12 and the electrical assembly board 14. The amount of movement of the actuator 20 in one example is the amount required to compress the fluid-permeable member 24 so that the liquid metal 30 contacts the heat sink 12 and electrical assembly board 14 such as illustrated by referring to FIG. 3.

There are many embodiments of the method for making the nano-structured conductive sponge 24. In one embodiment, a substrate such as the substrate 22 in FIGS. 1-3 is first provided. Then, a metal target such as Cu, Au, Ti, Ag, Ni, Pt, Pd or any compositions thereof is placed in a required distance and angle to the substrate such as 22. In the next process, the metal target is heated through resistance heating or struck by electron beams or ion beams such as argon beam in a physical vapor deposition chamber. When the deposition conditions such as distance, speed and angle are optimized, the metal atoms leave the metal target to deposit onto the substrate such as 22 and the remaining metal target forms the fluid-permeable member 24.

Another embodiment of the method for making a nano-structured conductive sponge 24 includes: providing a precursor material such as organometallic compounds and a substrate such as the substrate 22 in FIGS. 1-3; vaporizing the precursor material in a chemical vapor deposition chamber to make the precursor material deposit onto and react on the substrate; and generating the fluid-permeable member 24 by the reaction with the optimization of the deposition process.

Figure 5A:
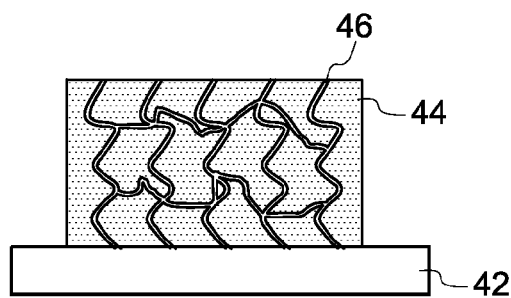
FIG. 5A to 5C are schematic diagrams illustrating intermediate products during the method of FIG. 4.
Figure 5B:
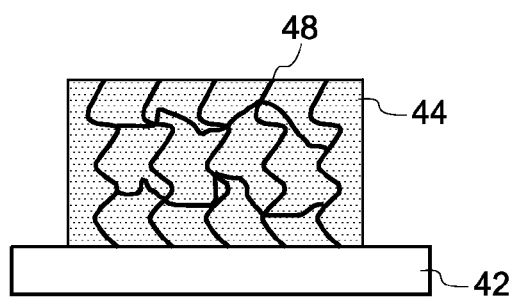
Figure 5C:
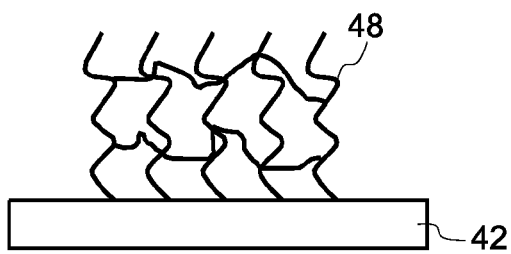

Referring to FIGS. 5A-5C and FIG. 4, still another embodiment of the method for making the nano-structured conductive sponge 24 includes the following steps. FIGS. 5A-5C illustrate intermediate products in the making process. In step 43, a substrate 42 and a porous template 44 with a plurality of pores 46 placed on the substrate 42 is provided. Then, in step 45, the metal material 48 is electroplated through the porous template 44 to permit the metal material 48 to be fully filled in the pores 46. In step 47, the porous template 44 is finally removed and the metal material 48 is left forming the fluid-permeable member 24.

In still another embodiment of the method for making the nano-structured conductive sponge 24, an alloy of two different metals is first deposited onto a substrate. One of the metals is a matrix (referred to as "matrix metal") and the other metal forms an interconnected network (referred to as "network metal") inside the matrix metal. After removing the matrix metal, the network metal forms the fluid-permeable member 24. In one embodiment, the porous template 44 is a porous polymer membrane or 3-dimensional aggregates of polymer particles.

In one embodiment, the methods above-mentioned further include a coating process for coating a passivation layer on the conductive sponge for preventing corrosion or oxidation. The passivation layer can be made of Au.

Figure 6:
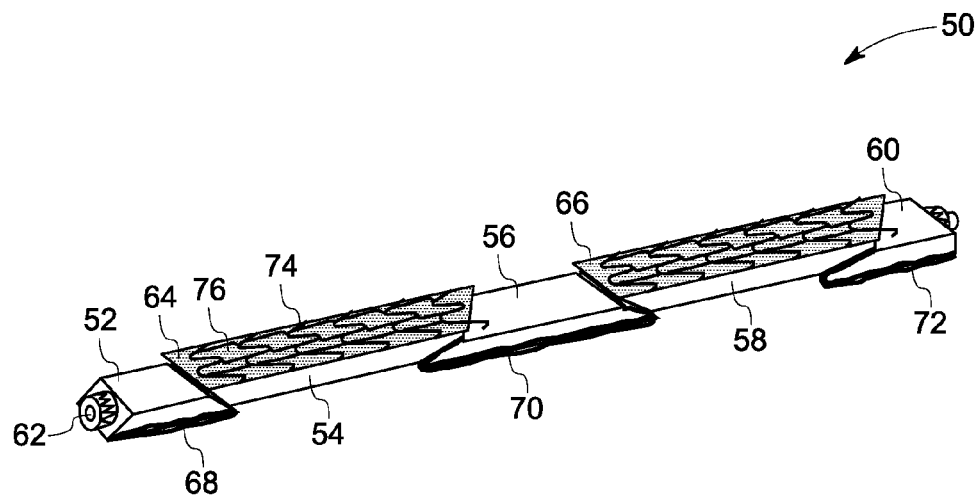
FIG. 6 is a schematic diagram of a locking device in accordance with still another embodiment.

FIG. 6 illustrates a wedge lock 50 in accordance with still one embodiment for providing mechanical and thermal connection in an electrical assembly. The wedge lock 50 has five wedge portions 52, 54, 56, 58 and 60 and a shaft 62 serving as an actuator to initiate at least some of the wedge portions 52, 54, 56, 58 and 60. In one embodiment, the wedge lock 50 includes at least two wedge portions installed together.

In the example shown in FIG. 6, the wedge portions 52, 54, 56, 58 and 60 are configured to engage each other when the shaft 62 is torqued, and wedge portions such as 54 and 58 move away from the wedge base portions 52, 56 and 60 towards the heat sink (not shown). Contact surfaces 64, 66, 68, 70 and 72 of the wedge lock 50 employ fluid-permeable sections saturated with a fluid therein. In the example shown in FIG. 6, the fluid-permeable sections are nano-structured metal sponges 74 saturated with liquid metal 76. In another embodiment, the fluid-permeable sections can be made of micro-structured material. In further embodiment, the fluid-permeable sections are made of sintered particles such as AlN particle spheres or polymer foam. Other porous wick structure with enough thermal conductivity and compressing ability also falls in the scope of the fluid-permeable sections.

It is readily understood that the liquid metal 76 is only an example of a fluid for being saturated in the fluid-permeable sections, and other fluids fall in the scope of the invention as long as the surface tension and thermal conductivity of these fluids can meet the practical requirements.

In the example shown in FIG. 6, when the actuator is engaged, contact surface 64 and 66 are configured to be proximate with a heat sink (not shown) and the sponge 74 is compressed so that the liquid metal 76 conductively contacts with the heat sink (not shown). In one example, the contact surface 68, 70 and 72 of the base wedge portions 52, 56, 60 are configured to be proximate to a heat generator (not shown) such as a PCB, a PWB and a circuit card when the actuator is engaged. Thus when the actuator is engaged, the wedge lock 50 provides optimal thermal dissipation from the heat generator (not shown) on one side of the wedge lock 50 to the heat sink (not shown) on the opposing side of the wedge lock 50. For such configuration, the wedge lock 50 provides a number of thermal conducting paths for dissipating heat.

According to one example, the base wedge portions 52, 56 and 60 are substantially stationary and proximate the electrical assembly board (not shown) and only the wedge portions 54 and 58 are configured to move to be proximate the heat sink (not shown). In another embodiment the wedge portions 54 and 58 are substantially stationary and proximate the heat sink and the base wedge portions 52, 56 and 60 are configured to move to be proximate the heat generator (not shown). In yet a further embodiment, both the base wedge portions 52, 56 and 60 and the wedge portions 54 and 58 are both configured to have some movement. The movement of the wedge portions 52, 54, 56, 58 and 60 forces the liquid metal 76 out of the sponges 74 to form liquid metal contact interfaces (not labeled) in a reversible process between surfaces 64, 66, 68, 70 and 72 of the wedge portion 52, 54, 56, 58 and 60. The liquid metal contact interfaces greatly reduce the thermal resistance of the wedge lock 50, thereby improving the thermal connection performance.

In one embodiment, all slanted surfaces of each wedge portion 52, 54, 56, 58, 60 are also configured to employ a fluid-permeable structure. In another embodiment, some wedge portions contacting with a heat generator such as a PCB, a PWB and a circuit card contain fluid-permeable structure on the corresponding slanted surfaces, while the other wedge portions have solid contact surfaces on the slanted surfaces. In still another embodiment, all portions of each wedge portion 52, 54, 56, 58 and 60 are configured to be fluid-permeable structure, as the configuration shown in FIG. 3.

Figure 7:
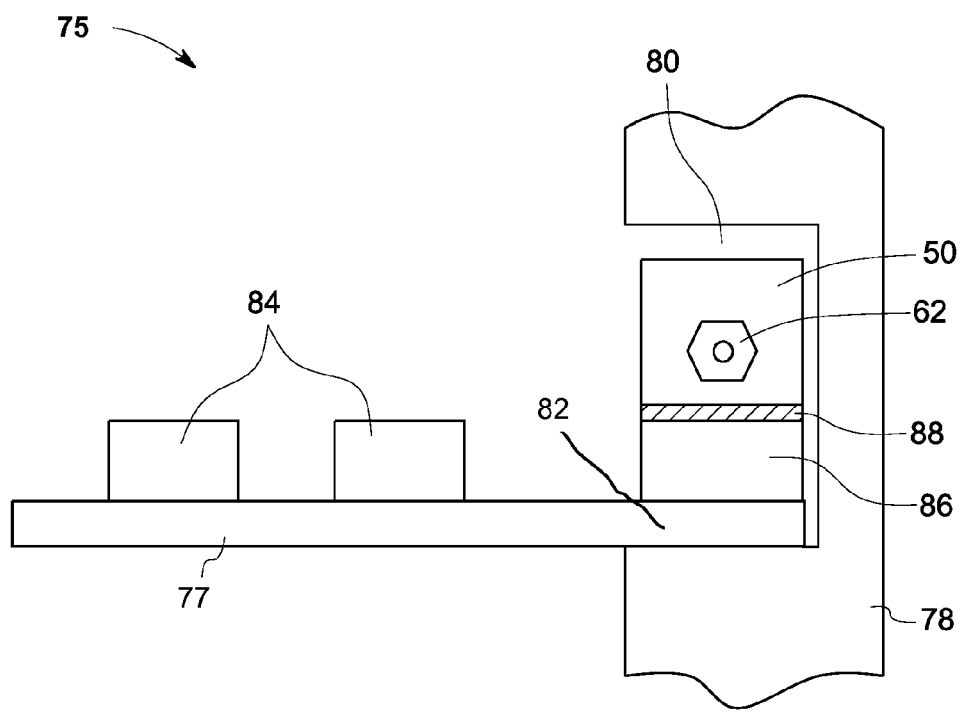
FIG. 7 is a schematic diagram of an electrical assembly with the locking device of FIG. 6 in a non-engaged status.

FIG. 7 illustrates an electrical assembly 75 using the wedge lock 50 for mechanically and thermally connecting an electrical assembly board 77 with a heat sink 78 in accordance with still another embodiment. Although the heat sink 78 in this example is a heat sink chassis, other types such as a heat spreader or a combination of a heat spreader and a heat sink chassis also fall in the scope of heat sink. The heat sink 78 defines a slot 80 where an edge portion 82 of the electrical assembly board 77 is secured by the wedge lock 50. In the example shown in FIG. 7, the electrical assembly board 77 has a plurality of the electrical components 84 mounted one side thereon. The wedge lock 50 is in non-engaged status in FIG. 7. The electrical assembly 75 further has a mounting rod 86 for protecting the electrical assembly board 77 from damage during engagement.

Figure 8:
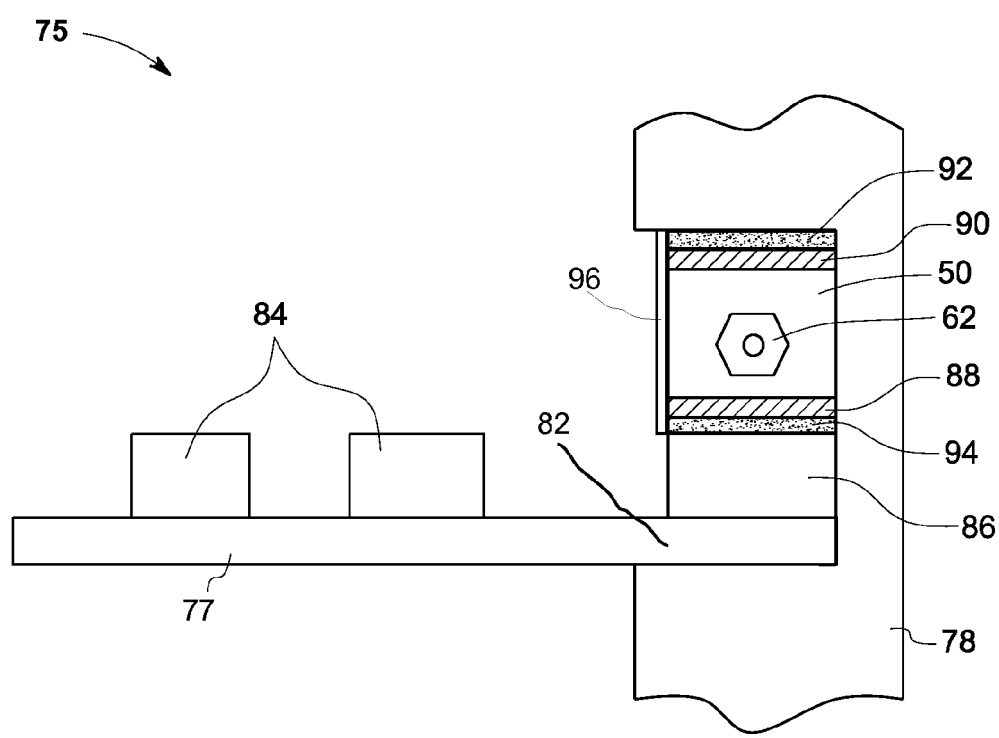
FIG. 8 is a schematic diagram of the electrical assembly of FIG. 7 with the locking device in an engaged status.

It should be pointed that, the reference number 88 in FIG. 7 stands for the contact surfaces 68, 70 and 72 in FIG. 6; and the reference number 90 in FIG. 8 stands for the contact surfaces 64 and 66.

FIG. 8 shows the wedge lock 50 engaging with the electrical assembly board 77 as well as the heat sink 78. Referring to FIGS. 5 and 7, the contact surfaces 88 and 90 are configured to be nano-structured metal sponge saturated with liquid metal 76. The shaft 62 imitates the wedge portions 52, 54, 56, 58 and 60, and then the contact surfaces 88 and 90 are forced to respectively engage the heat sink 78 and the mounting rod 86. Reaction forces compress contact surfaces 88 and 90 to squeeze the liquid metal out and form first and second liquid metal contact interfaces 92 and 94 in a reversible process. Liquid metal connections among wedge lock 50, the electrical assembly board 77 as well as the heat sink 78 results in reduced thermal resistance and finally improve the thermal conducting performance. By rotating the shaft 62 in the opposite direction, the sponges become uncompressed and the liquid metal is re-absorbed into the sponge. The surface area of nano-structure metal sponge can be 100 um$^2$-100 cm$^2$, and the thickness can be 1 um-1 cm. The dimensional change between compressed and relaxed states approximates to 1-60%. The thickness of the liquid metal interface between the sponge and the solid surface approximates to 0.5 um-1 mm.

In one embodiment, there are fluid retaining walls such as sidewall 96 in FIG. 8 that may be coupled to the electrical assembly board 77, the heat sink 78 or the wedge lock 50. The sidewalls not only prevent seepage of the liquid metal but also prevent dirt and debris from entering the locking wedge 50. It is understood that the sidewall 96 is only one example of fluid retaining wall, and other kinds of elements for retaining the fluid in position also fall in the scope of the fluid retaining wall. The fluid retaining wall can be designed according to the shape, size or other parameters of the wedge lock 50 or other kinds of locking member such as 10 in FIGS. 1 and 3.

It should be understood that the invention will not limits to the locking device for connecting a heat sink with an electrical assembly board. The invention can be used to any conductive and thermal connection applications.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A locking device providing thermal management for an electrical assembly board comprising:
   a fluid-permeable member saturated with a fluid and disposed between the electrical assembly board and a heat sink;
   a pair of locking device substrates substantially orthogonal to the electrical assembly board and the heat sink, wherein the fluid-permeable member is disposed between the locking device substrates; and
   an actuator coupled to at least one of the locking device substrates;
   wherein the actuator is configured to compress the fluid-permeable member by at least one of the locking device substrates forcing a portion of the fluid out of the fluid-permeable member and forming at least one fluid contact interface with the electrical assembly board and the heat sink in a reversible process.

2. The locking device of claim 1, further comprising at least one spacer between the locking device substrates and disposed within the fluid-permeable member wherein the spacer provides for one or more fluid-permeable segments.

3. The locking device of claim 2, wherein the spacer comprises a pair of spacer substrates substantially parallel and in close proximity with a flexible member disposed on either end of the spacer thereby joining the spacer substrates.

4. The locking device of claim 3, wherein the spacer substrates are coupled to the actuator such that the spacer substrates are moved apart by the actuator and the flexible member is compressed between the spacer substrates.

5. The locking device of claim 1, wherein the fluid-permeable member comprises a plurality of metal wires forming pores for fluid, and wherein at least some of the metal wires include a passivation layer.

6. The locking device of claim 5, wherein the metal wires comprises at least one of copper (Cu), gold (Au), titanium (Ti), silver (Ag), nickel (Ni), platinum (Pt), palladium (Pd) and compositions thereof.

7. The locking device of claim 6, wherein the metal wires comprises one of a hollow core and a polymeric core.

8. The locking device of claim 1, wherein the fluid-permeable member comprises a plurality of sintered particles or a polymer foam.

9. The locking device of claim 8, wherein the fluid comprises liquid metal which comprises at least one of gallium, indium, tin, indalloy, galinstant and compositions thereof.

10. The locking device of claim 1, further comprising a fluid retaining wall for preventing fluid seepage.

11. An electrical assembly, comprising:
    an electrical circuit board generating heat;
    a heat sink; and a locking device interposed between the electrical circuit board and the heat sink and comprising:
- a plurality of contact interfaces, wherein at least one of the contact interfaces is a fluid-permeable member saturated with a fluid;
- a pair of locking device substrates substantially orthogonal to the electrical circuit board and the heat sink; and
- an actuator coupled to at least one of the locking device substrates wherein the fluid is squeezed out of the fluid-permeable member when compressed by the actuator to form at least one fluid contact interface with the electrical assembly board and the heat sink in a reversible process.

12. The electrical assembly of claim 11, wherein the locking device further comprises at least one fluid retaining wall for preventing fluid seepage.

13. The electrical assembly of claim 11, wherein the fluid-permeable member comprises at least one micro- or nano-structured metal sponge saturated with a liquid metal.

14. The electrical assembly of claim 11, wherein the locking device comprises a plurality of wedge portions coupled to each other.

15. The electrical assembly of claim 14, wherein the wedge portions comprises at least one metal sponge.

* * * * *